United States Patent
Wang

(10) Patent No.: US 9,425,227 B1
(45) Date of Patent: Aug. 23, 2016

(54) IMAGING SENSOR USING INFRARED-PASS FILTER FOR GREEN DEDUCTION

(71) Applicant: VisEra Technologies Company Limited, Hsin-Chu (TW)

(72) Inventor: Wei-Ko Wang, Taoyuan (TW)

(73) Assignee: VisEra Technologies Company Limited, Hsin-Chu (TW)

( * ) Notice: Subject to any disclaimer, the term of this patent is extended or adjusted under 35 U.S.C. 154(b) by 0 days.

(21) Appl. No.: 14/717,512

(22) Filed: May 20, 2015

(51) Int. Cl.
*H01L 31/0232* (2014.01)
*H01L 27/146* (2006.01)

(52) U.S. Cl.
CPC .... *H01L 27/14621* (2013.01); *H01L 27/14645* (2013.01); *H01L 27/14649* (2013.01)

(58) Field of Classification Search
CPC ............ H01L 27/14621; H01L 27/14645; H01L 27/14649
USPC ............ 257/432, 294, E31.127, E31.121; 250/208.1, 338.1
See application file for complete search history.

(56) References Cited

U.S. PATENT DOCUMENTS

| 2008/0203305 A1* | 8/2008 | Suzuki | H01L 27/14649 250/338.1 |
| 2009/0009621 A1* | 1/2009 | Yamaguchi | H04N 5/33 348/222.1 |
| 2012/0056073 A1* | 3/2012 | Ahn | H01L 27/14609 250/208.1 |

FOREIGN PATENT DOCUMENTS

| CN | 103839952 (A) | 6/2014 |
| CN | 104167420 (A) | 11/2014 |
| TW | 201427418 (A) | 7/2014 |
| TW | 201505167 (A) | 2/2015 |

OTHER PUBLICATIONS

Taiwanese Office Action dated Jul. 4, 2016 in application No. 104122871, pp. 1-7.

* cited by examiner

*Primary Examiner* — Thien F Tran
(74) *Attorney, Agent, or Firm* — Muncy, Geissler, Olds & Lowe, P.C.

(57) ABSTRACT

An imaging sensor is provided. The imaging sensor includes: a filter array used for extracting a specified color component of an incident light; and photoelectric elements for receiving the incident light via the filter array. The filter array includes: a green filter for extracting a green component; a red filter for extracting a red component; a blue filter for extracting a blue component; and a first infrared filter for extracting a first infrared component for the green component. The first infrared filter is implemented by the green filter and an infrared high-pass filter of a specific wavelength.

20 Claims, 5 Drawing Sheets

IMAGING SENSOR USING INFRARED-PASS FILTER FOR GREEN DEDUCTION

BACKGROUND OF THE INVENTION

1. Field of the Invention

The present invention relates to an imaging sensor and, in particular, to an image device including red, green, and blue color filters and an infrared (IR) pass filter for better color balance.

2. Description of the Related Art

Traditional color imagers, image sensors, and pixelated imaging arrays use a Bayer pattern of pixels and pixel filters, which has a red-green-green-blue (R-G-G-B) pixel/filter configuration (shown in FIG. 1). In such pixelated arrays, the sensor includes individual optical filters that transmit red, green or blue colors and that are disposed at or coated on the individual pixels. Thus, there is a "red pixel" 12a, a "blue pixel" 12b and two "green pixels" 12c arranged to form a 2×2 sub-array 10 that is repeated over the pixelated array.

The three color filters (R, G, and B) not only pass ranges of wavelengths or spectral bands that are corresponding to red, green and blue colors, they also pass through a significant amount of wavelengths in the infrared (IR) or near infrared (NIR) region or band of the spectrum. Therefore, the color imager sensitivity or quantum efficiency spectrum typically has a rich IR or NIR response even with the R, G, and B color pixels. For example, a typical silicon CMOS color sensor's spectrum response is shown in FIG. 2. The spectrum response of the R, G and B pixels (e.g. curves 210, 220 and 230) is comparable or higher than the pixels' response of visible spectrum. The IR light from the environment thus may wash-out the color response in the visible spectrum and may distort the image color reproduction. This is often referred to as IR contamination.

In a traditional color camera, in order to reproduce a true color image, an IR cut-off filter is usually used to cut off or reduce light or energy at or in the IR band or region of the spectrum so as to allow only (or substantially only) the visible light (e.g. light having wavelengths from 390 nm to 700 nm) to pass through the filter so as to be imaged by the RGGB pixels, in order to reduce, limit, or substantially eliminate the IR contamination. Such an IR cut-off filter is typically made of multilayer coatings on a glass or plastic element, such as a flat glass plate, that is added on to a lens assembly of the imager or onto a surface of a lens element of the lens assembly of the imager. The coating process and added material increase the cost of the lens, sometimes significantly

BRIEF SUMMARY OF THE INVENTION

A detailed description is given in the following embodiments with reference to the accompanying drawings.

An imaging sensor is provided. The imaging sensor includes: a filter array used for extracting a specified color component of an incident light; and photoelectric elements for receiving the incident light via the filter array. The filter array comprises: a green filter for extracting a green component; a red filter for extracting a red component; a blue filter for extracting a blue component; and a first infrared filter for extracting a first infrared component for the green component. The first infrared filter is implemented by the green filter and an infrared high-pass filter of a specific wavelength.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
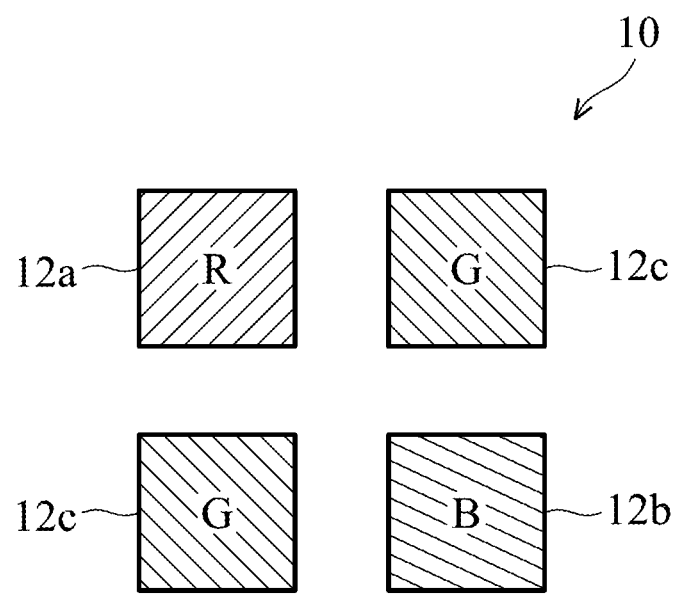
FIG. 1 is a diagram of a typical Bayer pattern.
Figure 2:
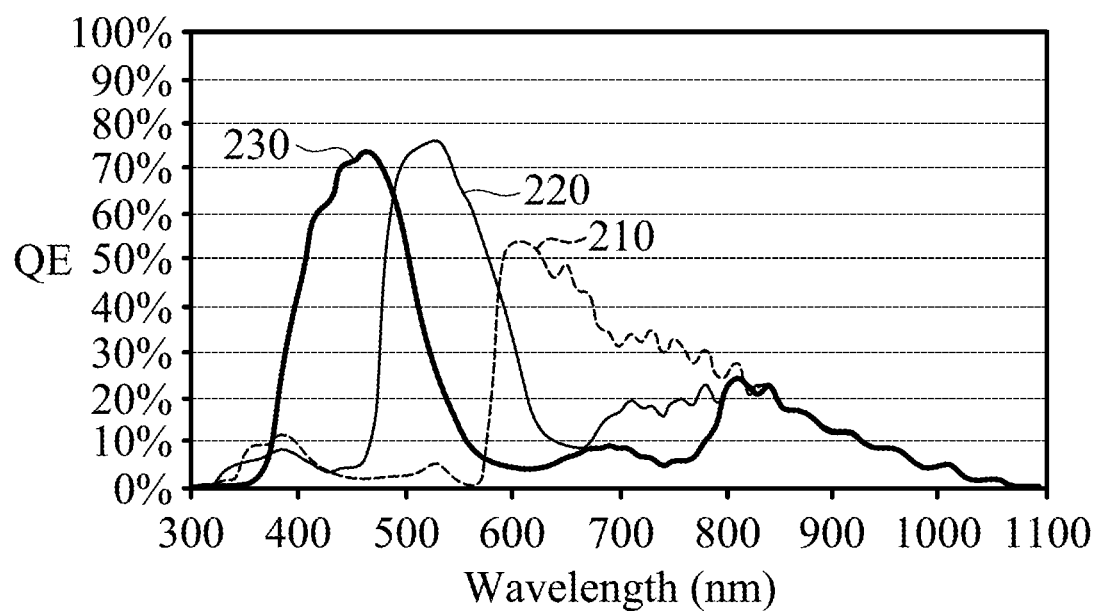
FIG. 2 is a diagram of a silicon CMOS RGB color sensor's spectrum response.
Figure 3:
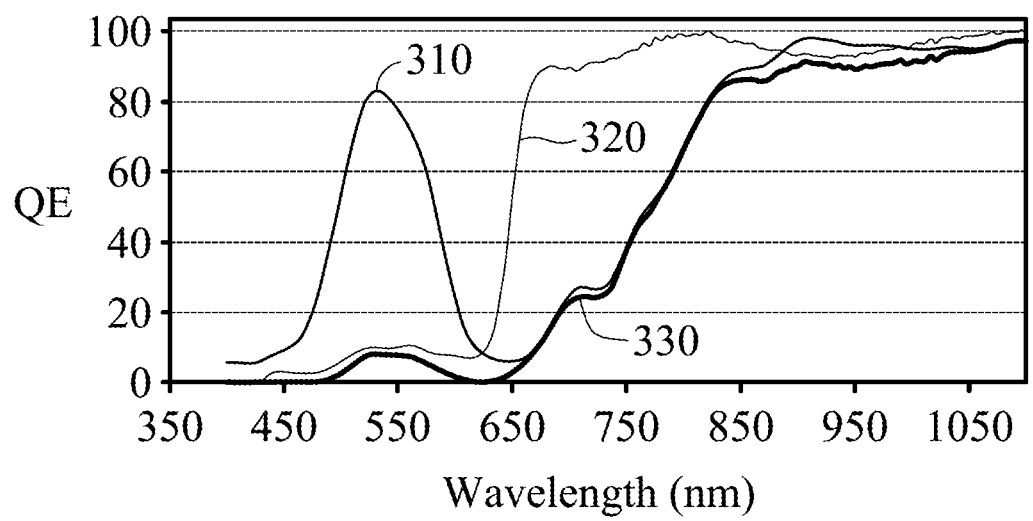
FIG. 3 is a spectrum diagram of the IRP4Gd filter in accordance with an embodiment of the invention.

FIG. 3 is a spectrum diagram of the IRP4Gd filter in accordance with an embodiment of the invention. The IRP4Gd filter of the present invention is designed to mix the spectrums of the green filter and an IR-pass filter (a high-pass filter) which allows light having a wavelength longer than 650 nm to pass through (hereinafter IR-pass@650 nm is used). For example, the spectrum of the green filter and the IR-pass filter are shown as curves 310 and 320 in FIG. 3. The spectrum of the IRP4Gd filter is shown as curve 330 in FIG. 3. The IRP4Gd filter can be implemented in 2 ways, such as stacking the green filter and the IR-pass@650 nm filter, or mixing the materials of the green filter and the IR-pass@650 nm filter as a single material.

For the color subtraction algorithm provided in the present invention, the spectrum of green, red, and blue color channels can be expressed as follows:

$$S_G - S_{IRP4Gd} = S_{G'V}$$

$$S_R - S_{IRP4Rd} = S_{R'V}$$

$$S_B - S_{IRP4Bd} = S_{B'V}$$

where $S_G$, $S_R$, and $S_B$ denote the original signal for the green, red and blue color channels; $S_{IRP4Gd}$ denotes the signal of the IR-pass filter for green deduction; $S_{IRP4Rd}$ denotes the signal of the IR-pass filter for red deduction; $S_{IRP4Bd}$ denotes the signal of the IR-pass filter for blue deduction; and $S_{G'V}$, $S_{R'V}$, $S_{B'V}$ denote the modified (color-balanced) signal for the green, red, and blue color channels, respectively. Specifically, the infrared signal $S_{IRP4Gd}$, $S_{IRP4Rd}$, $S_{IRP4Bd}$ are subtracted from the green, red, and blue color channels, respectively. Thus, no additional IR-cut filter is required in front of the image sensor in the invention, so that the cost of the whole imaging sensor can be reduced and the thickness of camera modules can be thinner.

As described above, the IRP4Gd filter can be implemented by stacking the IR-pass@650 nm filter and the green filter or mixing the materials of the IR-pass@650 nm filter and the green filter. In addition, the IRP4Rd filter can be implemented by the IR-pass@650 nm filter, and the IRP4Bd filter can be implemented by the IR-pass filter which allows light having a wavelength longer than 800 nm to pass (hereinafter IR-pass@800 nm is used). However, the IR-pass@800 nm filter (a high pass filter) can be easily implemented by mixing the materials of the red and blue filters.

The imaging sensor of the present invention comprises a two-dimensional pixelated imaging array having a plurality of photo-sensing pixels or photoelectric elements arranged or disposed or established on a semiconductor substrate. For example, the imaging sensor may comprise a complementary-metal-oxide-semiconductor (CMOS) or a CCD imaging sensor or device or the like. The details can be referred to in the following embodiments.

Figure 4A:
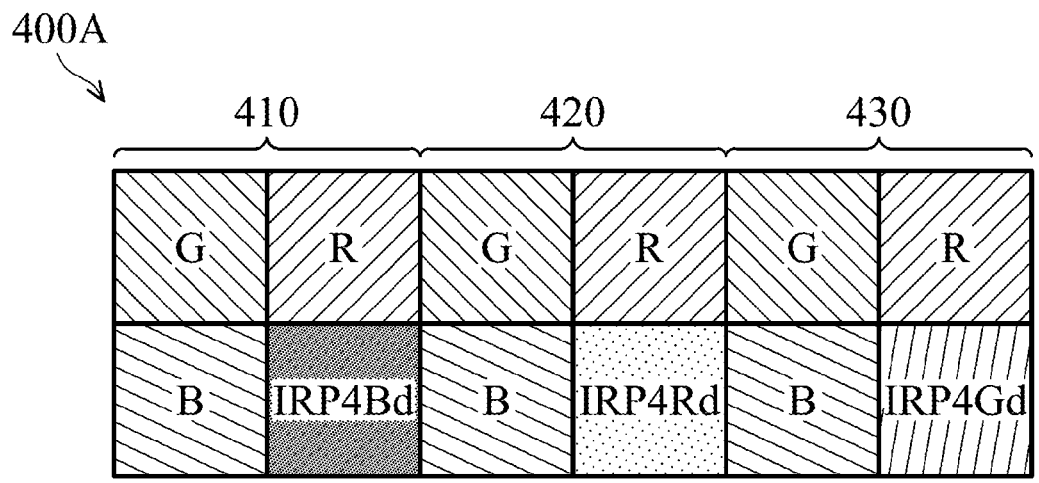
FIG. 4A is a diagram of the arrangement of the first color mosaic patterns in accordance with an embodiment of the invention.

FIG. 4A is a diagram of the arrangement of the first color mosaic patterns in accordance with an embodiment of the invention. As shown in FIG. 4A, since the IR subtraction algorithm is used, different IR pixels (e.g. IRP4Rd, IRP4Gd, IRP4Bd) can be placed in different locations in an array unit 400. For example, the array unit 400A comprises three horizontally adjacent color patterns 410, 420 and 430. The color pattern 410 includes the R, G, B filters and the IRP4Bd filter. The color pattern 420 includes the R, G. B filters and the IRP4Rd filter. The color pattern 430 includes the R, G, B, filter and the IRP4Gd filter. Preferably, each of the color patterns 410, 420, and 430 can also be used as a standalone in some implementations.

Figure 4B:
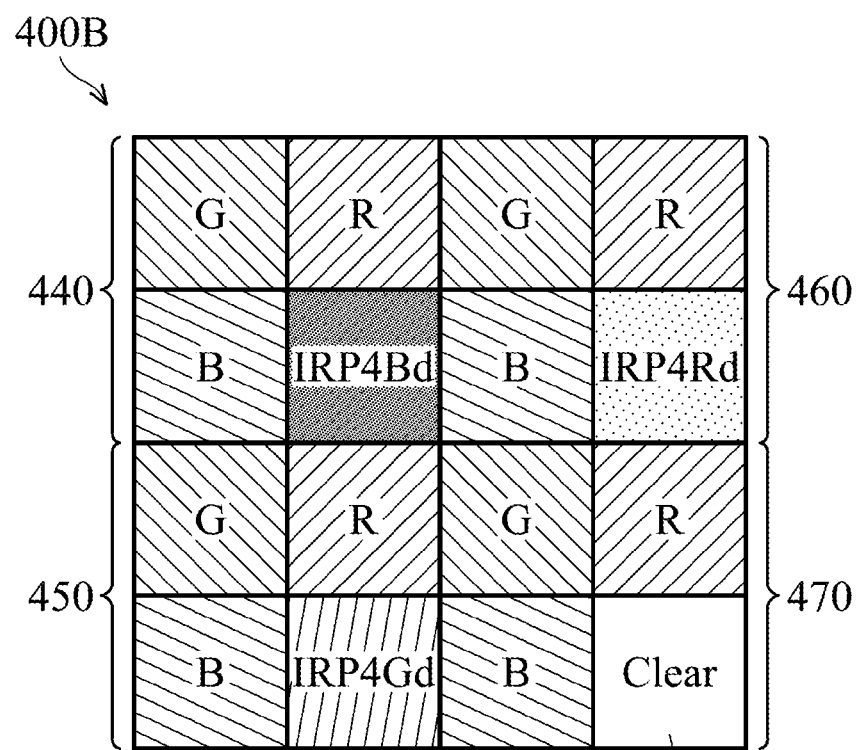
FIG. 4B is a diagram of the arrangement of the second color mosaic patterns in accordance with another embodiment of the invention.

FIG. 4B is a diagram of the arrangement of the second color mosaic patterns in accordance with another embodiment of the invention. Alternatively, the color patterns can be arranged in an array unit 400 having a 2×2 window. The array unit 400B includes color patterns 440, 450, 460, and 470. The color patterns 440, 450, and 460 are similar to the color patterns 410, 420 and 430 shown in FIG. 4A. However, a transparent pixel 471 (i.e. a clear pixel) is included in the color pattern 470.

Figure 5:
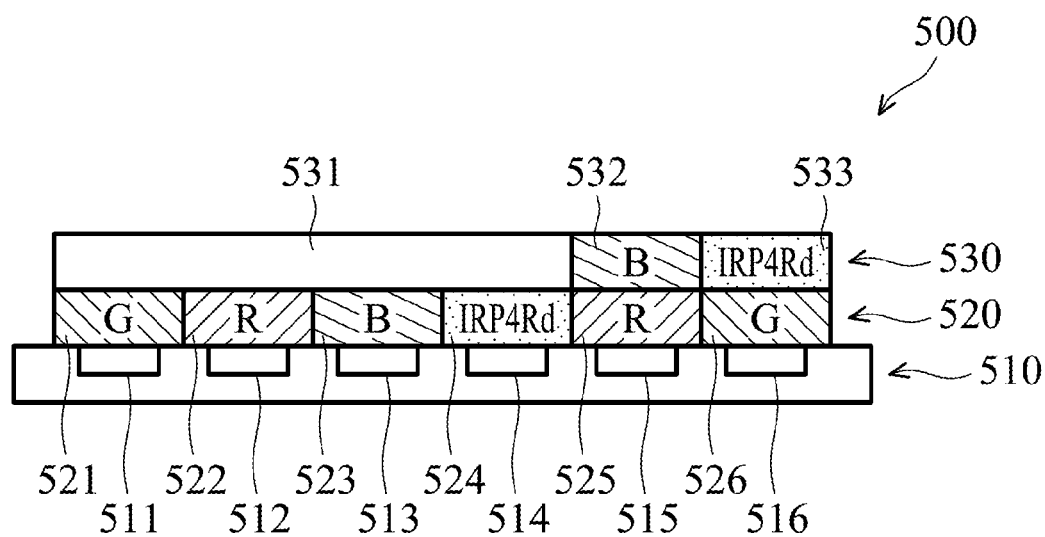
FIG. 5 is a cross-sectional view of an imaging sensor according to a first embodiment of the invention.

FIG. 5 is a cross-sectional view of an imaging sensor according to a first embodiment of the invention. The imaging sensor 500 includes a semiconductor substrate 510, a first layer 520, and a second layer 530. Photoelectric elements 511~516 for different color channels (e.g. for green, red, blue, IRP4Rd, IRP4Gd, and IRP4Bd colors) are implemented on the semiconductor substrate 510. The order of color filters from left to right on the first layer 520 is the green filter 521, red filter 522, blue filter 523, IRP4Rd filter 524, red filter 525, and green filter 526. The second layer 530 includes a transparent material 531, a blue filter 532, and an IRP4Rd filter 533. The transparent material 531 covers on the filters 521~524 in order to complete the flatness of the coating surface. The blue filter 532 covers on the red filter 525, and the stacking of the blue filter 532 and the red filter 525 forms the IRP4Bd filter (i.e. B+R) which allows light having a wavelength longer than 800 nm to pass. The IRP4Rd filter 533 covers on the green filter 526, and the stacking of the IRP4Rd filter 533 and the green filter 526 forms an IRP4Gd filter which allows incident light having a wavelength longer than 650 nm to pass.

Specifically, although there are 6 types of color filters, such as R, G, B, IRP4Gd, IRP4Rd, and IRP4Bd filters, the aforementioned six materials can be actually simplified into four materials during the manufacturing of the imaging sensor 500. For example, since the blue filter 532 has to be disposed on the red filter 525 and the IRP4Rd filter has to be disposed on the green filter 526, the manufacturing order of the color filters may be the green filters, the red filters, the blue filters and the IRP4Rd filters. After implementing the aforementioned color tilters, a "flatness of coating (FOC)" process is performed, so that the transparent material 531 can be placed on the filters 521~524 for a flat surface.

Figure 6:
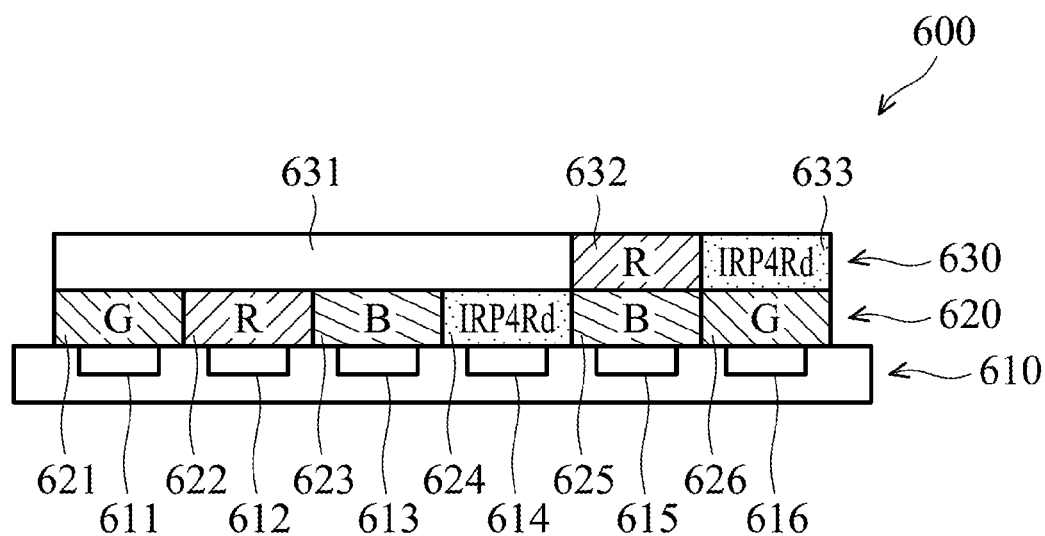
FIG. 6 is a cross-sectional view of an imaging sensor according to another embodiment of the invention.

FIG. 6 is a cross-sectional view of an imaging sensor according to another embodiment of the invention. The imaging sensor 600 includes a semiconductor substrate 610, a first layer 620, and a second layer 630. Photoelectric elements 611~616 for different color channels (e.g. for green, red, blue, IRP4Rd, IRP4Gd, and IRP4Bd colors) are implemented on the semiconductor substrate 610. The order of color filters from left to right on the first layer 620 is the green filter 621, red filter 622, blue filter 623, IRP4Rd filter 624, blue filter 625, and green filter 626. The second layer 630 includes a transparent material 631, a red filter 632, and an IRP4Rd filter 633. The transparent material 631 covers on the filters 621~624 in order to complete the flatness of coating surface. The blue filter 632 covers on the red filter 625, and the stacking of the red filter 632 and the blue filter 625 forms the IRP4Bd filter (i.e. B+R) which allows light having a wavelength longer than 800 nm to pass. The IRP4Rd filter 633 covers on the green filter 626, and the stacking of the IRP4Rd filter 633 and the green filter 626 forms an IRP4Gd filter which allows incident light having a wavelength longer than 650 nm to pass.

The imaging sensor 600 is similar to the imaging sensor 500. The difference between the imaging sensors 500 and 600 is that the stacking of the IRP4Bd filter is different. For example, the blue filter 532 is disposed on the red filter 525 in the imaging sensor 500 shown in FIG. 5, but the red filter 632 is disposed on the blue filter 625 in the imaging sensor 600 shown in FIG. 6.

Figure 7:
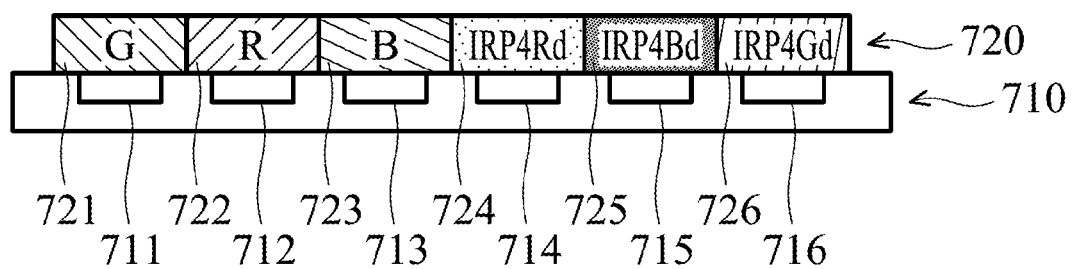
FIG. 7 is a cross-sectional view of an imaging sensor according to yet another embodiment of the invention.

FIG. 7 is a cross-sectional view of an imaging sensor according to yet another embodiment of the invention. Although the materials used in the manufacturing process can be simplified to 4 materials (e.g. R, G, B, and IRP4Rd) in the imaging sensors 500 and 600, 6 materials can also be used in the imaging sensors 500 and 600. For example, in addition to the 4 materials for R, G, B and IRP4Rd color channels, the materials for the IRP4Gd and IRP4Bd color channels can also be used in the imaging sensor 700. In other words, the materials of the blue filter and the red filter can be mixed to generate the material of the IRP4Bd channel, and the materials of the green filter and the IRP4Rd filter can be mixed to generate the material of the IRP4Gd channel. The imaging sensor 700 includes a semiconductor substrate 710, and a first layer 720. Photoelectric elements 711~716 for different color channels (e.g. for green, red, blue, IRP4Rd, IRP4Bd, and IRP4Gd colors) are implemented on the semiconductor substrate 710. The order of color filters from left to right on the first layer 720 is the green filter 721, red filter 722, blue filter 723, IRP4Rd filter 724, IRP4Bd filter 725, and IRP4Gd filter 726. The IRP4Bd filter (i.e. B+R) allows light having a wavelength longer than 800 nm to pass, and the IRP4Gd filter allows incident light having a wavelength longer than 650 nm to pass.

In view of the above, an imaging sensor is provided. The imaging sensor comprises an infrared filter IRP4Gd for green color deduction, where the IRP4Gd filter is implemented by a mixture or stacking of the materials of the green filter and the 650 nm high pass infrared filter. With the material IRP4Gd filter, the infrared filters for the red and blue color deduction can be implemented using the existing red filter, blue filter, and the IRP4Gd filter, and thus each color channel (e.g. R, G. B) may have its own deduction channel. Accordingly, the imaging sensor of the present invention provides better color balance for the green, red, and blue color channels. Furthermore, no additional IR-cut filter is required in front of the image sensor in the invention, so that the cost of the whole imaging sensor can be reduced and the thickness of camera modules can be thinner.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An imaging sensor, comprising:
  a filter array for extracting a plurality of color components of an incident light; and
  photoelectric elements for receiving the incident light via the filter array,
  wherein the filter array comprises:
    a green filter for extracting a green component from the plurality of color components;
    a red filter for extracting a red component from the plurality of color components;
    a blue filter for extracting a blue component from the plurality of color components; and
    a first infrared filter for extracting a first infrared component, wherein the first infrared filter comprises a material of the green filter and a material of an infrared high-pass filter of a specific wavelength.

2. The imaging sensor as claimed in claim 1, wherein the specific wavelength is 650 nm.

3. The imaging sensor as claimed in claim 1, wherein the first infrared filter is implemented by a mixture of the material of the green filter and the material of the infrared high-pass filter.

4. The imaging sensor as claimed in claim 1, wherein the first infrared filter is implemented by stacking of the green filter and the infrared high-pass filter.

5. The imaging sensor as claimed in claim 1, wherein the filter array further comprises:
  a second infrared filter for extracting a second infrared component; and
  a third infrared filter for extracting a third infrared component.

6. The imaging sensor as claimed in claim 5, wherein the second infrared filter is implemented by a mixture of a material of the red filter and a material of the blue filter.

7. The imaging sensor as claimed in claim 5, wherein the second infrared filter is implemented by stacking of the red filter and the blue filter.

8. The imaging sensor as claimed in claim 5, wherein the third infrared filter is implemented by the infrared high-pass filter.

9. The imaging sensor as claimed in claim 5, wherein the filter array further comprises three horizontally adjacent array units, wherein a first array unit of the three array units comprises the green filter, the red filter, the blue filter, and the first infrared filter, and a second array unit of the three array units comprises the green filter, the red filter, the blue filter, and the second infrared filter, and a third array unit of the three array units comprises the green filter, the red filter, the blue filter, and the third infrared filter.

10. The imaging sensor as claimed in claim 5, the filter array further comprises four array units arranged in a 2×2 window, and the four array units comprises a first array unit, a second array unit, a third array unit, and a fourth array unit,
  wherein the first array unit comprises the green filter, the red filter, the blue filter, and the first infrared filter, and the second array unit comprises the green filter, the red filter, the blue filter, and the second infrared filter, and the third array unit comprises the green filter, the red filter, the blue filter, and the third infrared filter, and the fourth array unit comprises the green filter, the red filter, the blue filter, and a clear pixel.

11. The imaging sensor as claimed in claim 5, wherein the first, second, and third infrared components are subtracted from the green component, the blue component, and the red component to obtain color-balanced green, blue, and red components, respectively.

12. The imaging sensor as claimed in claim 5, wherein the second infrared filter is an infrared-pass filter which allows the incident light having a wavelength longer than 800 nm to pass.

13. The imaging sensor as claimed in claim 5, wherein the first infrared filter is implemented by stacking of the green filter and the third infrared filter or mixing the material of the green filter and a material of the third infrared filter.

14. An imaging sensor, comprising:
  a semiconductor substrate comprising a plurality of photoelectric elements; and
  a filter array, disposed on the semiconductor substrate, wherein the filter array comprises a green filter, a red filter, a blue filter, and a first infrared filter,
  wherein the first infrared filter comprises a material of the green filter and a material of an infrared high-pass filter of a specific wavelength.

15. The imaging sensor as claimed in claim 14, wherein the specific wavelength is 650 nm.

16. The imaging sensor as claimed in claim 14, wherein the first infrared filter is implemented by a mixture of the material of the green filter and the material of the infrared high-pass filter.

17. The imaging sensor as claimed in claim 14, wherein the first infrared filter is implemented by stacking of the green filter and the infrared high-pass filter.

18. The imaging sensor as claimed in claim 14, wherein the first infrared filter is for extracting a first infrared component, and the filter array further comprises:
  a second infrared filter for extracting a second infrared component; and
  a third infrared filter for extracting a third infrared component.

19. The imaging sensor as claimed in claim 18, wherein the second infrared filter is implemented by a mixture of a material of the red filter and a material of the blue filter, or implemented by stacking the red filter and the blue filter.

20. The imaging sensor as claimed in claim 18, wherein the third infrared filter is implemented by the infrared high-pass filter.

* * * * *